(12) United States Patent
Webster

(10) Patent No.: US 6,417,039 B2
(45) Date of Patent: *Jul. 9, 2002

(54) METHOD OF MANUFACTURING A SEMICONDUCTOR DEVICE COMPRISING A SEMICONDUCTOR BODY HAVING A SURFACE PROVIDED WITH A COIL HAVING A MAGNETIC CORE

(75) Inventor: Marian N. Webster, Eindhoven (NL)

(73) Assignee: Koninklijke Philips Electronics N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/397,742

(22) Filed: Sep. 16, 1999

(30) Foreign Application Priority Data

Sep. 17, 1998 (EP) ............................................. 98203103

(51) Int. Cl.⁷ .......................................... H01L 21/8234
(52) U.S. Cl. ............................ 438/238; 438/381; 438/3
(58) Field of Search ............................... 438/3, 381, 238

(56) References Cited

U.S. PATENT DOCUMENTS

| | | | | |
|---|---|---|---|---|
| 3,614,554 A | | 10/1971 | Shield et al. ................. 317/235 |
| 6,030,877 A | * | 2/2000 | Lee et al. .................... 438/381 |
| 6,054,329 A | * | 4/2000 | Burghartz et al. ............. 438/3 |
| 6,118,351 A | * | 9/2000 | Kossives et al. ........... 333/24.1 |

\* cited by examiner

*Primary Examiner*—Jey Tsai
(74) *Attorney, Agent, or Firm*—Aaron Waxler

(57) ABSTRACT

The invention relates to a method of manufacturing a semiconductor device comprising a semiconductor body (1) having a coil (3) with a magnetic core (4). By means of this method, the surface is provided with a first metallization layer (5) having a first pattern of conduction tracks (6) which are embedded in an insulating material (7, 8, 9). A layer of a magnetic material is provided on the surface (10), which faces away from the semiconductor body. A magnetic core is formed in said layer by means of etching. On the magnetic core and on the adjoining surface of the first metallization layer, a second metallization layer (11) with a second pattern of embedded conduction tracks is formed in an insulating material (13, 14). The second pattern is connected to the first pattern in such a way that windings of the coil are formed. The first metallization layer is formed on the surface of the semiconductor body in such a manner that the surface of the metallization layer facing away from the semiconductor body is planar. The layer of magnetic material having a thickness below 50 nm is subsequently provided. The method in accordance with the invention enables coils to be manufactured which exhibit a relatively high self-induction when used at frequencies above 100 MHz.

8 Claims, 4 Drawing Sheets

METHOD OF MANUFACTURING A SEMICONDUCTOR DEVICE COMPRISING A SEMICONDUCTOR BODY HAVING A SURFACE PROVIDED WITH A COIL HAVING A MAGNETIC CORE

BACKGROUND OF THE INVENTION

The invention relates to a method of manufacturing a semiconductor device comprising a semiconductor body having a surface which is provided with a coil having a magnetic core, in which method, the surface of the semiconductor body is provided with a first metallization layer having a first pattern of conductor tracks embedded in insulating material, and a surface, which faces away from the semiconductor body, on which a layer of a magnetic material is deposited in which the magnetic core is formed by means of an etch treatment, whereafter the magnetic core and the adjacent surface of the first metallization layer are provided with a second metallization layer having a second pattern of conductor tracks embedded in an insulating material, said second pattern of conductor tracks being connected to the first pattern of conductor tracks so as to form windings of the coil.

This method can particularly suitably be used to manufacture integrated circuits comprising one or more coils. Such integrated circuits are used, for example, in mobile telephone apparatus. In the manufacture of integrated circuits, the semiconductor body is provided with semiconductor elements which are electrically interconnected. The surface of the semiconductor body is provided with a number of metallization layers with patterns of conductor tracks embedded in an insulating material. By adding only a few more process steps, coils can be incorporated, as indicated hereinabove, in integrated circuits.

The coil is provided with a magnetic core. As a result, a coil is obtained having a self-induction which may be a factor of the order of the relative magnetic susceptibility $\mu_r$ larger than the self-induction of an equally large coil without a core. By virtue thereof, a coil whose self-induction is as large as possible can be realized on a part of the semiconductor body surface which is as small as possible.

In U.S. Pat. No. 3,614,554, a description is given of a method of the type mentioned in the opening paragraph, in which the first metallization layer is formed by successively applying a layer of an insulating material to the surface of the semiconductor body, forming the first pattern of conductor tracks on this layer and covering this pattern and the layer of insulating material situated next to this pattern with a further layer of an insulating material. The core is formed by etching in a layer of permalloy (an alloy of nickel, iron; cobalt, magnesium and copper) having a thickness of approximately 750 nm. The coil covers a surface area of approximately 3 by 2.5 mm.

In practice it has been found that the known method is not very suitable for the manufacture of coils for circuits which are intended for processing signals whose frequencies are above 100 MHz. At these high frequencies, coils manufactured by means of the known method exhibit self-inductions which do not exceed those of coils which do not have a core of magnetic material.

SUMMARY OF THE INVENTION

It is an object of the invention to provide a method by means of which it is possible to produce coils whose self-induction is much greater than that of equally large coils without a core of magnetic material.

To achieve this, the method mentioned in the opening paragraph is characterized in that the first metallization layer is formed on the surface of the semiconductor body in such a manner that the surface of said metallization layer facing away from the semiconductor body is flat, whereafter the layer of a magnetic material is deposited in a thickness below 50 nm.

In accordance with the invention, the thickness of the core of the coil is chosen so as to be much smaller than the thickness of 750 nm mentioned in the known method. As a result, the coil is smaller in section, so that the self-induction should be proportionally smaller. It has however been found that, at these high frequencies, a thin layer has a relative magnetic susceptibility $\mu_r$ which is so much higher than a thicker layer that the coil formed nevertheless has a higher self-induction. If the thickness of the core is chosen to be, for example, a factor of 10 smaller, then the sectional dimension of the coil is also reduced by approximately a factor of 10, however, since the relative magnetic susceptibility of the core may be a factor of 500 higher, a coil is formed having a self-induction which nevertheless may be a factor of 50 higher.

If in the known method use is made of such a much thinner magnetic layer, the coils formed still do not have a higher self-induction than coils without a core. In the method in accordance with the invention, in which the layer of magnetic material is deposited on a flat surface, the coils formed do have a higher self-induction. In the known method, the layer of magnetic material is deposited on a surface which is not flat. An approximately 500 nm thick layer of an insulating material is applied to the approximately 750 nm thick conductor tracks of the first pattern of conductor tracks. The topography of this layer corresponds to that of the conductor tracks. If the very thin layer of magnetic material is deposited on such a non-flat surface, then the layer formed is not homogeneous. Said layer exhibits differences in thickness and, possibly, interruptions which may be the reason why the magnetic core does not lead to he desired high self-induction of the coils. If the layer of magnetic material is deposited on a flat surface, then the desired homogeneous layer is obtained and coils having the desired high self-inductions are formed.

A substantial freedom of choice of the material to be used for the layer of magnetic material is obtained if the conductor tracks of both patterns of conductor tracks are embedded in an insulating material in such a manner that the magnetic core is electrically insulated from the conductor tracks of both patterns. The magnetic material may be an alloy of electroconductive materials, such as iron, chronium, tantalum, cobalt, niobium and zirconium, for example an alloy of iron and 4.6 at. % chromium, 0.2 at. % tantalum and 7.4 at. % nitrogen. Preferably, the layer of magnetic material is a layer packet composed of magnetic sub-layers having a thickness below 10 nm which are separated from each other by intermediate layers of a non-magnetic material, such as copper or an insulating material, having a thickness below 5 nm. In this manner, a magnetic core can be formed having a $\mu_r$ which is very high at frequencies above 100 MHz. If, for example, approximately 6 nm thick sub-layers are formed of a magnetic alloy comprising, apart from iron, cobalt, niobium and zirconium, which sub-layers are separated from each other by approximately 2 nm thick intermediate layers of aluminium nitride, then such a packet has a $\mu_r$ of approximately 400 at 100 MHz, a $\mu_r$ of 200 at 1 GHz and a $\mu_r$ of 100 at 400 GHz.

A very compact coil is obtained if the magnetic core is formed in a layer of a magnetic material which is electrically insulating, and the conductor tracks of both patterns of conductor tracks are embedded in insulating material in such a manner that the magnetic core electrically contacts the conductor tracks of both patterns. An example of such a material is manganese-zinc-ferrite ($Mn_{0.50}Zn_{0.42}Fe_{2.03}O_4$) which has a resistivity of $10^6$ $\mu\Omega cm$ and which is substantially insulating in comparison with metals, such as aluminium which has a resistivity of 2.7 $\mu\Omega cm$.

To ensure that the conductor tracks of the first pattern of conductor tracks are electrically insulated from the magnetic core, the first metallization layer may be obtained by successively applying a layer of an insulating material onto the surface of the semiconductor body, forming the first pattern of conductor tracks on this layer, covering this pattern and the layer of insulating material next to this pattern with a further layer of an insulating material, and planarizing this further layer of insulating material. This planarization may be carried out by means of a customary chemico-mechanical polishing treatment or by applying a layer of a photoresist followed by an etch treatment in a plasma or etch bath in which the photoresist and the insulating material are etched at an equal rate. As a result, a layer of an insulating material remains on the conductor tracks. In practice, this remaining layer does not have a uniform thickness. In addition, this layer must be relatively thick to ensure that the underlying conductor tracks are not locally exposed during the planarization treatment.

Preferably, the first metallization layer is formed by successively applying a layer of an insulating material to the surface of the semiconductor body, forming grooves in this layer, depositing a metal layer on the layer of insulating material and into the grooves, subjecting the metal layer to a planarization treatment until the insulating layer is exposed again, and depositing a further layer of an insulating material. In this case, the further layer of an insulating material, which can be very homogeneously deposited in a customary manner, also has a flat surface and may be thinner than, for example, 100 nm. This thin layer of insulating material causes the conductor tracks and the magnetic core to be insulated from each other.

This preferred embodiment of the method in accordance with the invention has the additional advantage that there is a great freedom of choice of the metal to be used for the conductor tracks. For example, the conductor tracks in this embodiment may be made of copper, so that the coil exhibits a small electric resistance. The planarization treatment can be carried out in a customary manner.

The number of materials that can be chosen for the part of the coil windings formed by the second metallization layer is also greater if the second metallization layer is formed by successively covering the core and the adjacent part of the first metallization layer with a further layer of an insulating material, forming grooves in this layer without exposing the magnetic core, depositing a layer of metal on the further layer of insulating material and into the grooves, and subsequently subjecting the metal layer to a planarization treatment until the insulating layer is exposed again. The accuracy with which the grooves are formed can be so high that the conductor tracks of the second pattern can be insulated from the magnetic core by a layer of an insulating material of a very small thickness below 100 nm.

The conductor tracks of the first pattern of conductor tracks are embedded, in a simple manner, in insulating material such that the magnetic core electrically contacts the conductor tracks of the first pattern if a layer of an insulating material is provided on the surface of the semiconductor body; this is achieved by successively forming grooves in this layer, depositing a layer of a metal on the layer of insulating material and into the grooves, subjecting the metal layer to a planarization treatment until the insulating layer is exposed again. If the layer of insulating magnetic material is subsequently deposited, then this layer directly contacts the conductors of the first pattern of conductors.

The conductor tracks of the second pattern of conductor tracks are embedded, in a simple manner, in insulating material such that the magnetic core electrically contacts the conductor tracks of the second pattern if a further layer of an insulating material is provided on the core and the adjoining part of the first metallization layer; this is achieved by successively forming grooves in this layer, thereby exposing the core, depositing a layer of metal on the further layer of insulating material and into the grooves, and subjecting the metal layer to a planarization treatment until the insulating layer is exposed again.

As indicated hereinabove, this method makes it possible to choose the metal used for both patterns of conductors from a wide range of metals, and for example copper may be used.

These and other aspects of the invention will be apparent from and elucidated with reference to the embodiment(s) described hereinafter, which constitute(s) a non-limitative example.

DESCRIPTION OF THE PREFERRED EMBODIMENTS

Figure 1:
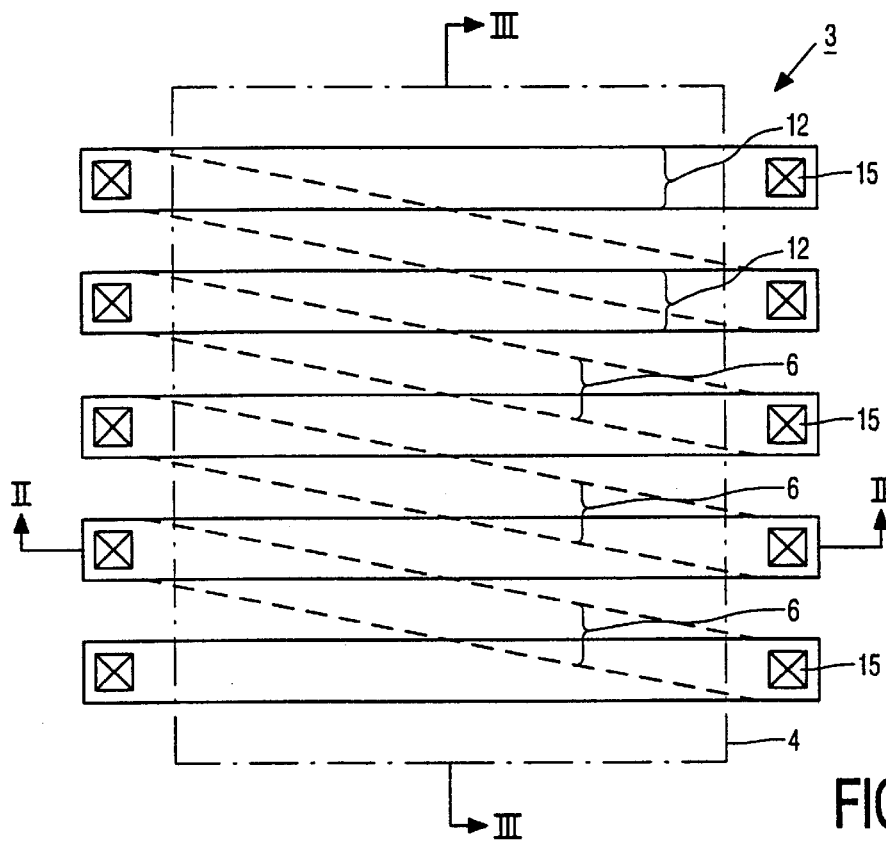
FIG. 1 is a diagrammatic plan view of a relevant part of a first semiconductor device manufactured by means of the method in accordance with the invention.
Figure 2:
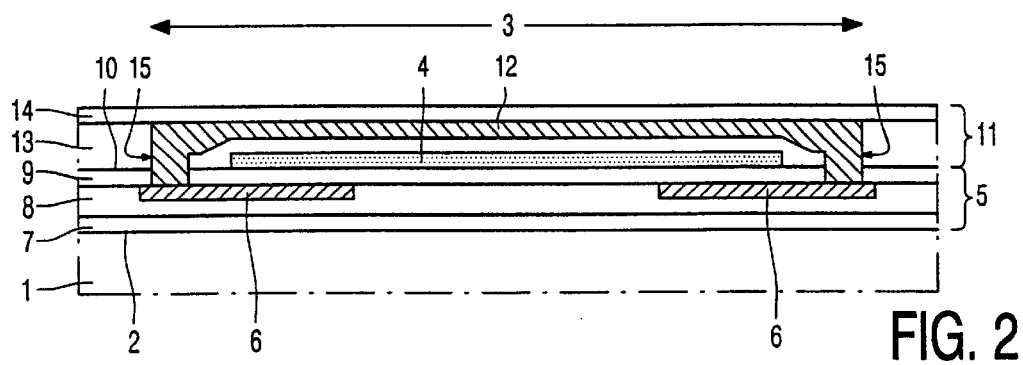
FIG. 2 is a diagrammatic, cross-sectional view of the semiconductor device shown in FIG. 1, taken on the line II—II.
Figure 3:
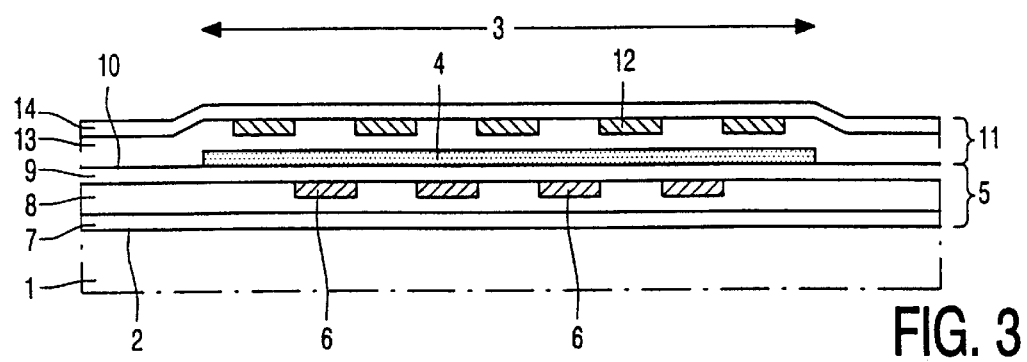
FIG. 3 is a diagrammatic, cross-sectional view of the semiconductor device shown in FIG. 1, taken on the line III—III.
Figure 4:
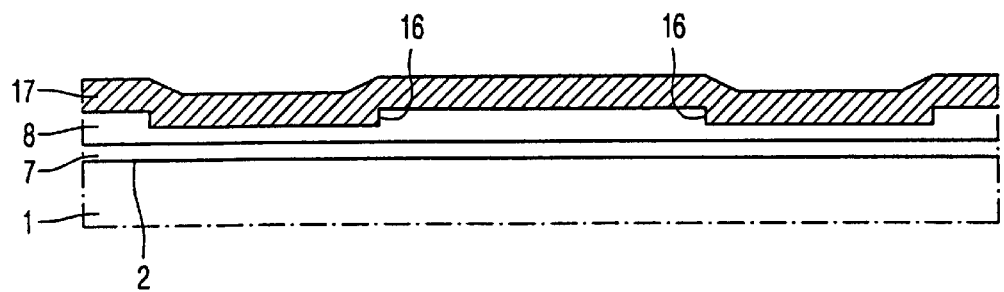
FIGS. 4 through 9 are diagrammatic, cross-sectional views of several stages in the manufacture of the first semiconductor device shown in FIG. 1, using the method in accordance with the invention.
Figure 5:
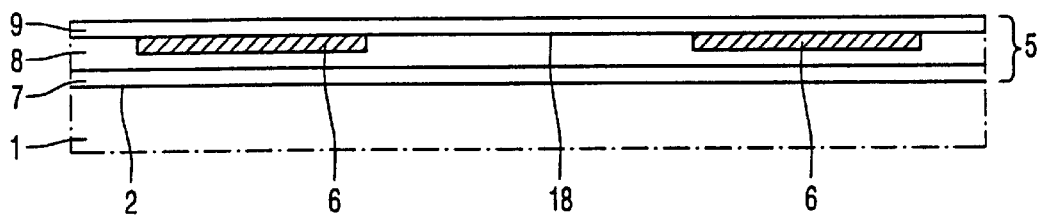
Figure 6:
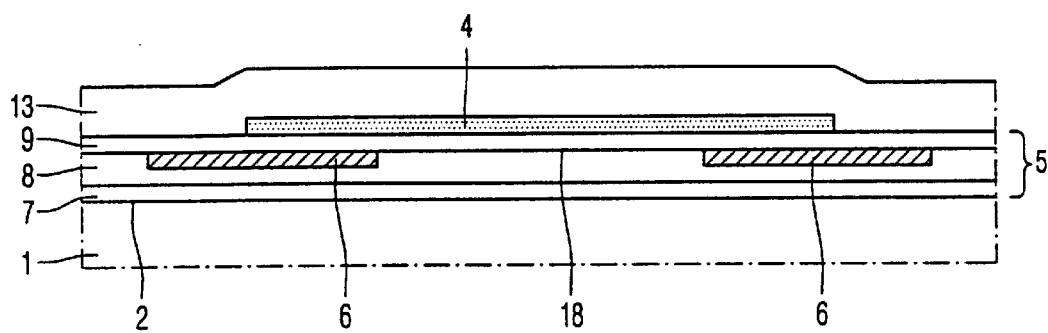
Figure 7:
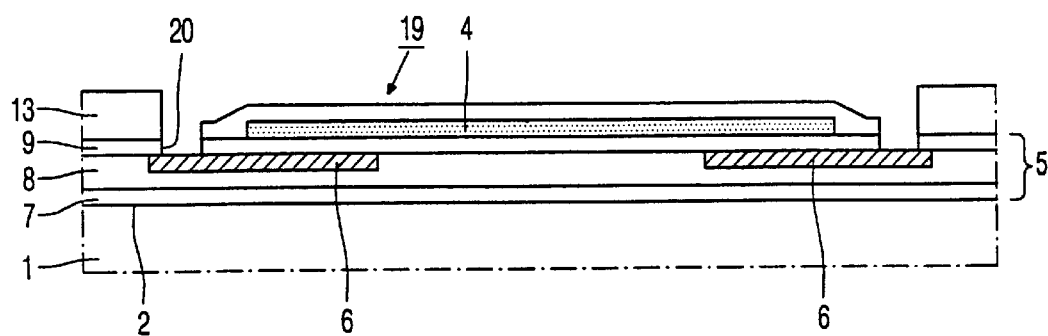
Figure 8:
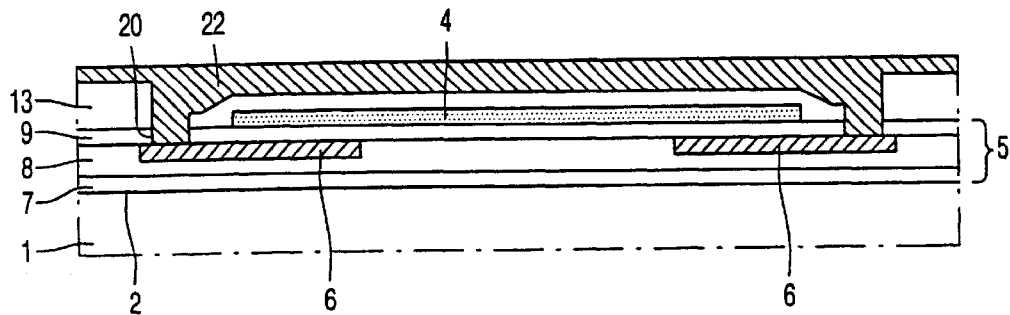
Figure 9:
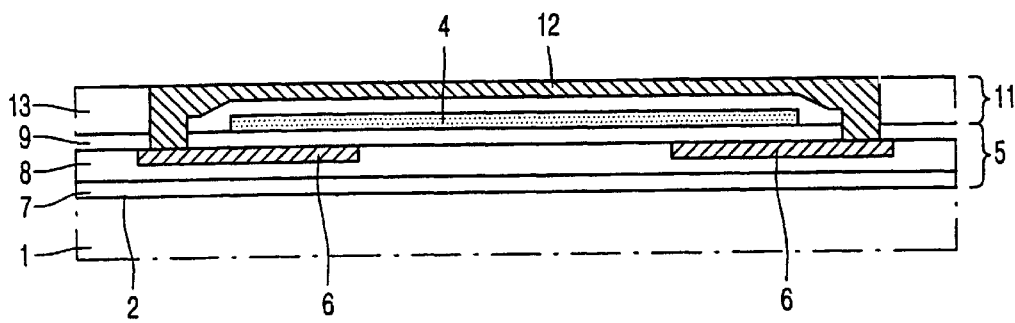
Figure 10:
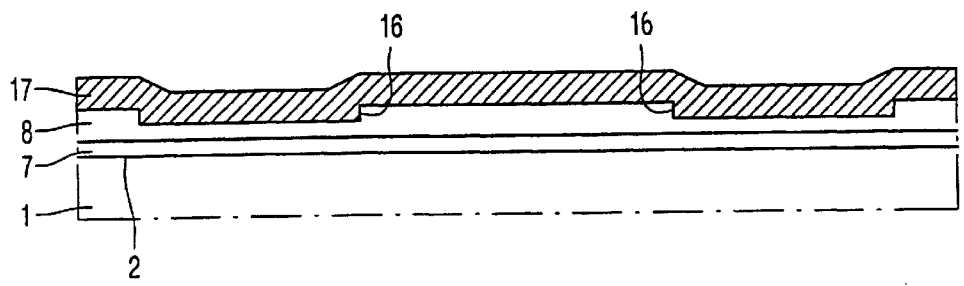
FIGS. 10 through 15 are diagrammatic, cross-sectional views of several stages in the manufacture of a second semiconductor device, using the method in accordance with the invention.
Figure 11:
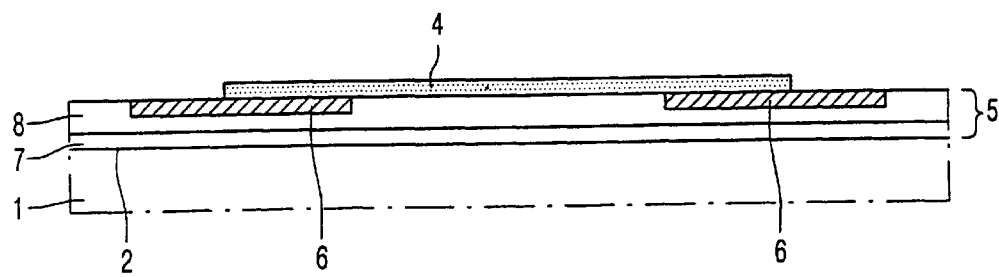
Figure 12:
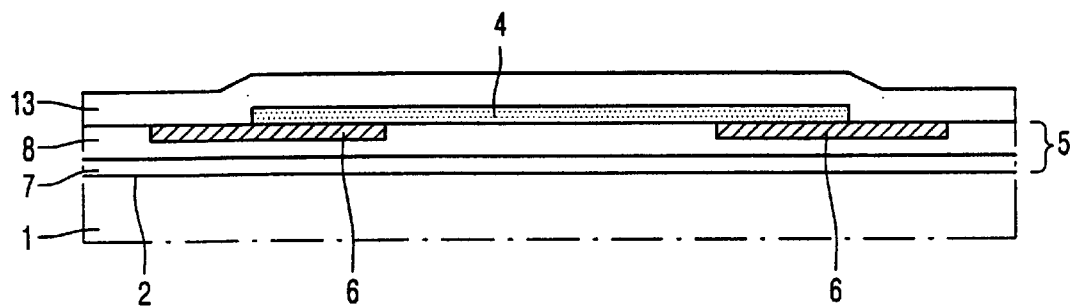
Figure 13:
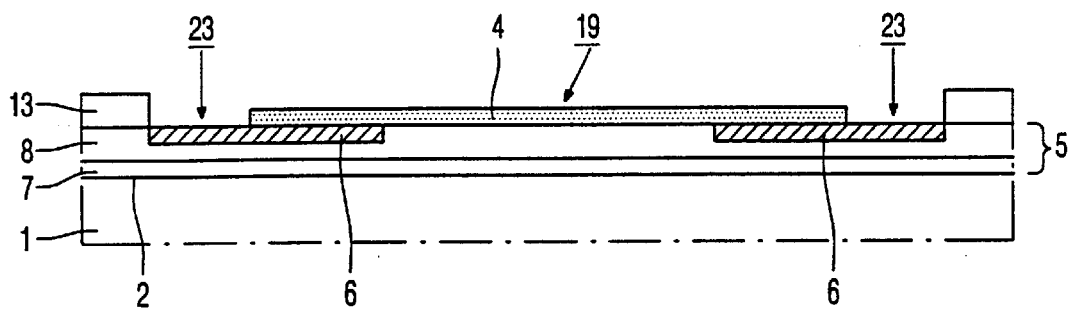
Figure 14:
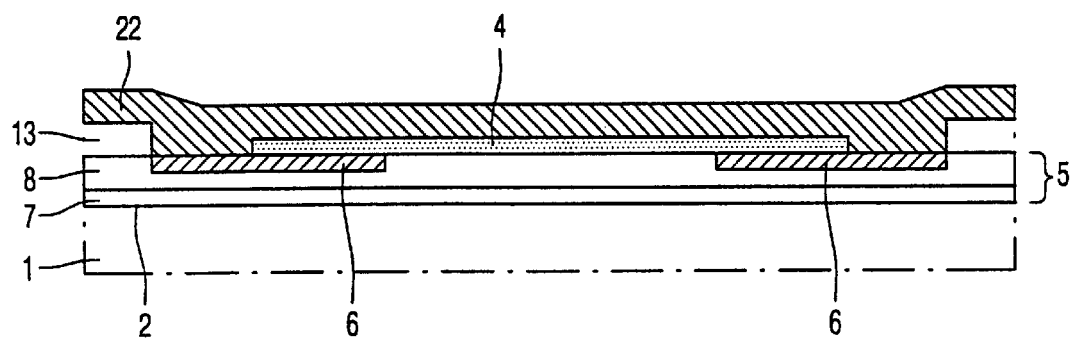
Figure 15:
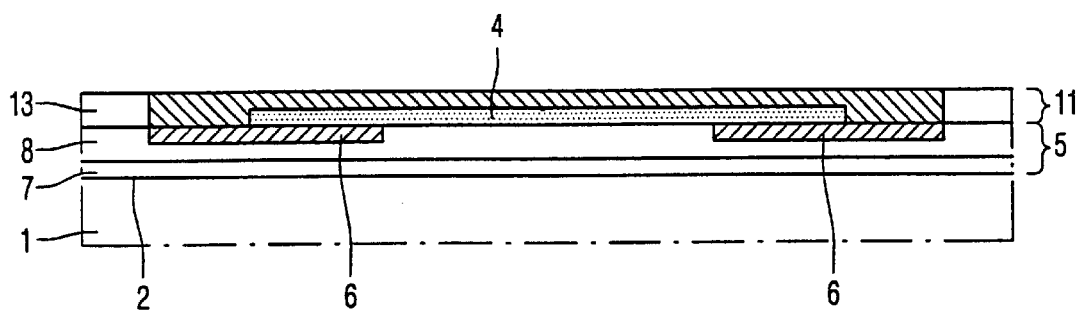

In the drawings, which are diagrammatic and not to scale, like reference numerals refer to like parts. FIG. 1 and FIGS. 2 and 3 show, respectively, in plan view and in cross-section, a first semiconductor device comprising a semiconductor body 1 having a surface 2 which is provided with a coil 3 having a magnetic core 4. The surface 2 is provided with a first metallization layer 5 having a first pattern of conductor tracks 6, which are embedded in an insulating material, in this example three layers of insulating material 7, 8 and 9. This first metallization layer 5 has a surface 10, which faces away from the semiconductor body 1, on which the magnetic core 4 is formed. On the magnetic core 4 and on the adjacent surface 10 of the first metallization layer 5, there is provided a second metallization layer 11 having a second pattern of conductor tracks 12, which are embedded in an insulating material, in this example two layers of insulating material 13 and 14. The second pattern of conductors 12 is connected by windows 15 to the first pattern of conductors 6, so that windings of the coil are formed.

FIGS. 4 through 9 show, in cross-section, several stages in the manufacture of the first semiconductor device shown in FIG. 1. In the manufacture, use is made of a semiconductor body 1, in this example a slice of silicon. The surface 2 of said semiconductor body is customarily provided with an approximately 100 nm thick layer of silicon oxide 7 by means of thermal oxidation of silicon.

The first metallization layer 5 is formed on this insulating layer 7 by providing the surface of the semiconductor body with a layer of an insulating material 8, in this example a deposited layer of silicon oxide having a thickness of 700 nm. Subsequently, grooves 16 having a depth of approximately 500 nm are etched in a customary manner in this layer, said grooves having the shape of the conductor tracks 6 to be formed. Subsequently, an approximately 700 nm thick layer of metal 17, in this example aluminium, is deposited on the layer of insulating material 8 and into the grooves 16. Next, this layer of metal 17 is subjected to a planarization treatment which is continued until the insulating layer 8 is exposed again. In this manner, the conductor tracks 6 of the first metallization layer 5 are formed. The insulating layer 8 and the conductor tracks 6 formed therein exhibit a flat surface 18. Finally, a further layer of an insulating material 9, in this example an approximately 100 nm thick layer of silicon oxide, is deposited on said surface. Due to its small thickness, this layer is flat too.

In accordance with the invention, the first metallization layer 5 is formed on the surface 2 of the semiconductor body 1 in such a manner that the surface 18 thereof, which faces away from the semiconductor body, is flat. On this flat surface 18, there is deposited the thin layer of insulating material 9 and a layer of a magnetic material having a thickness of less than 50 nm in which the core 4 is formed by etching.

The core 4 of the coil 3 has a thickness below 50 nm. It has been found that the relative magnetic susceptibility $\mu_r$ of a thin magnetic layer at frequencies above 100 MHz is so much higher than that of a thicker layer that a coil is formed whose self-induction is higher than it would be if a thicker layer of magnetic material were used. If the core thickness is chosen to be, for example, a factor of 100 larger, also the sectional dimension of the coil increases by approximately a factor of 100, but since the relative magnetic susceptibility of the core may then be a factor of 500 smaller, a coil is formed whose self-induction is substantially equal to that of a coil without a magnetic core.

If the thin layer of magnetic material is deposited on a surface which is not flat, then the layer formed is not homogeneous. Said layer exhibits differences in thickness and possible interruptions which may be responsible for the fact that the magnetic core does not lead to the desired, high self-induction of the coils. If the layer of magnetic material is deposited on a flat surface, then the desired homogeneous layer is obtained and coils having the desired, high self-induction are formed.

The second metallization layer 11 is formed by covering the core 4 and the adjoining part of the insulating layer 9 with a further layer of an insulating material 13, in the example an approximately 700 nm thick layer of silicon oxide. Subsequently, approximately 500 nm deep grooves 19 which correspond to the second pattern of conductors 12 are formed in said further layer of insulating material. In this process, the magnetic core 4 is not exposed. In addition, windows 20 are etched in the layer of insulating material 13, within which windows the conductors 6 of the first metallization layer 5 are exposed. Subsequently, a layer of metal 22, in this case an approximately 700 nm thick layer of aluminium, is deposited on the further layer of insulating material 13, into the grooves 20 and in the windows 21. Finally, this layer is subjected to a planarization treatment which is continued until the insulating layer 13 is exposed again. The metal-filled grooves 20 then constitute the conductor tracks 12 of the second metallization layer 11.

Finally, the whole is covered with an approximately 100 nm thick layer of an insulating material 14, in this example silicon oxide. In the manner described hereinabove, the semiconductor device shown in FIGS. 1 through 3 is obtained. In this embodiment, the conductor tracks 6 and 12 of both patterns of metallization layers 5 and 11 are embedded in an insulating material in such a manner that the magnetic core 4 is fully electrically insulated from the conductor tracks 6 and 12 of both patterns. By virtue thereof, a great freedom of choice of material for the layer of magnetic material is obtained. The magnetic material may now be an alloy of electroconductive materials, such as iron, cobalt, niobium and zirconium. A suitable alloy is, for example, an alloy of iron with 4.6 at. % chromium, 0.2 at. % tantalum and 7.4 at. % nitrogen. If such a layer is deposited in a thickness ranging between 20 and 50 nm, then such a layer has an $\mu_r$ of 300 at 1 GHz. If the thickness is 100 nm, then the $\mu_r$ at this frequency is below 10.

Preferably, the layer of magnetic material is a layer packet, not shown, which is composed of magnetic sub-layers having a thickness below 10 nm, which are separated from each other by intermediate layers of insulating material having a thickness below 5 nm. In this manner, a magnetic core can be formed having a very high $\mu_r$ at frequencies above 100 MHz. If, for example, approximately 6 nm thick sub-layers are formed of a magnetic alloy comprising, in addition to iron, cobalt, niobium and zirconium, which are separated from each other by approximately 2 nm thick intermediate layers of aluminium nitride, then such a packet has a $\mu_r$ of approximately 400 at 100 MHz, a $\mu_r$ of 200 at 1 GHz and a $\mu_r$ of 100 at 4 GHz.

FIGS. 10 through 15 are diagrammatic, cross-sectional views of several stages in the manufacture of a second semiconductor device, using the method in accordance with the invention. The stage in the manufacture shown in FIG. 10 corresponds to that shown in FIG. 4. The metal layer, which also in this case is an aluminium layer, is deposited into the grooves 16 in the layer of insulating material 8, which grooves correspond to the conductor tracks 6 to be formed of the first metallization layer 5. After planarization, in which process the layer of insulating material 8 is exposed again, the layer of magnetic material, in which the core 4 is formed by etching, is directly deposited onto this layer 8 and onto the conductor tracks 6 formed. In this example, the layer of magnetic material is also substantially electrically insulating.

Subsequently, the second metallization layer 11 is formed by covering the core 4 and the adjacent part of the first metallization layer 5 in a customary manner with an insulating layer 13, in this example an approximately 500 nm thick layer of silicon oxide. Grooves 19 which correspond to the second pattern of conductors 12 are subsequently formed in this layer of insulating material 13. In these grooves, the core 4 and the parts 23 of the conductors of the first metallization layer 5 situated next to the core are exposed. Subsequently, the metal layer 22 is deposited, in this example an approximately 700 nm thick layer of aluminium.

Subsequently, a planarization treatment is carried out until the layer of insulating material 13 is exposed again. The metal-filled grooves 19 then constitute the conductor tracks 12 of the second metallization layer 11. Both patterns of conductor tracks 4 and 12 form the windings of the coil 3. Finally, the whole is covered with a layer of insulating material, which is not shown.

In the second example, the magnetic core 4 is formed in a layer of a magnetic material which is substantially electrically insulating, and the conductor tracks 4 and 12 of both patterns of conductor tracks are embedded in layers of insulating material (respectively 7, 8, and 13, 14) in such a manner that the magnetic core electrically contacts the conductor tracks 4 and 12 of both patterns. An example of such a material is manganese-zinc-ferrite ($Mn_{0.50}Zn_{0.42}Fe_{2.03}O_4$) which has a resistivity of $10^6$ $\mu\Omega$cm and which is substantially electrically insulating in comparison with metals such as aluminium, which has a resistivity of 2.7 $\mu\Omega$cm. In this manner, a very compact coil is obtained, the core 4 being directly surrounded by windings of the coil. At the same sectional dimension of the core, the coil described in the second example will have a higher self-induction than the coil described in the first example.

In both examples, the conductor tracks 6 and 12 are obtained by filling etched grooves with a metal. As a result, many metals can suitably be used to form the conductors. Apart from aluminium, the conductor tracks can also be made, for example, of copper.

What is claimed is:

1. A method of manufacturing a semiconductor device comprising a semiconductor body having a surface which is provided with a coil having a magnetic core, in which method, the surface of the semiconductor body is provided with a first metallization layer having a first pattern of conductor tracks embedded in insulating material, and a surface, which faces away from the semiconductor body, on which a single substantially planar layer of a magnetic material is deposited directly on the first metallization layer in which the magnetic core is formed by means of an etch treatment, whereafter the magnetic core and the adjacent surface of the first metallization layer are provided with a second substantially planar metallization layer having a second pattern of conductor tracks embedded in an insulating material, said second pattern of conductor tracks being connected to the first pattern of conductor tracks at both ends thereof so as to form windings of the coil, characterized in that the first metallization layer is formed on the surface of the semiconductor body in such a manner that the surface of said first metallization layer facing away from the semiconductor body is flat, and comprising the step of depositing the layer of a magnetic material to a thickness of less than 50 nm, and wherein the magnetic material is selected to be substantially electrically insulating.

2. A method as claimed in claim 1, characterized in that the conductor tracks of both patterns of conductor tracks are embedded in an insulating material in such a manner that the magnetic core is electrically insulated from the conductor tracks of both patterns.

3. A method as claimed in claim 1, characterized in that the magnetic core is formed in a layer of a magnetic material which is electrically insulating, and the conductor tracks of both patterns of conductor tracks are embedded in insulating material in such a manner that the magnetic core electrically contacts the conductor tracks of both patterns.

4. A method as claimed in claim 2, characterized in that the first metallization layer is formed by successively applying a layer of an insulating material to the surface of the semiconductor body, forming grooves in this layer which correspond to the grooves of the conductor tracks of the first metallization layer, depositing a metal layer on the layer of insulating material and into the grooves, subjecting the metal layer to a planarization treatment until the insulating layer is exposed again, and depositing a further layer of an insulating material.

5. A method as claimed in claim 4, characterized in that the second metallization layer is formed by successively covering the core and the adjacent part of the first metallization layer with a further layer of an insulating material, forming grooves in this layer which correspond to the conductor tracks of the second metallization layer, without exposing the magnetic core, depositing a layer of metal on the further layer of insulating material and into the grooves, and subsequently subjecting the metal layer to a planarization treatment until the insulating layer is exposed again.

6. A method as claimed in claim 2, characterized in that the layer of magnetic material is a layer packet composed of magnetic sub-layers having a thickness below 10 nm which are separated from each other by intermediate layers of a non-magnetic material having a thickness below 5 nm.

7. A method as claimed in claim 3, characterized in that the first metallization layer is formed by successively applying a layer of an insulating material to the surface of the semiconductor body, forming grooves in this layer which correspond to the conductor tracks of the first metallization layer, depositing a metal layer on the layer of insulating material and into the grooves, subjecting the metal layer to a planarization treatment until the insulating layer is exposed again, and depositing the layer of an insulating magnetic material.

8. A method as claimed in claim 5, characterized in that the second metallization layer is formed by successively covering the core and the adjacent part of the first metallization layer with a further layer of an insulating material, forming grooves in this layer, which correspond to the conductor tracks of the second metallization layer, thereby exposing the core, depositing a layer of metal on the further layer of insulating material and into the grooves, and subsequently subjecting the metal layer to a planarization treatment until the insulating layer is exposed again.

* * * * *